(12) United States Patent
Wang

(10) Patent No.: US 8,590,483 B2
(45) Date of Patent: Nov. 26, 2013

(54) COATING DEVICE

(75) Inventor: Chung-Pei Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 498 days.

(21) Appl. No.: 12/975,243

(22) Filed: Dec. 21, 2010

(65) Prior Publication Data

US 2012/0042824 A1 Feb. 23, 2012

(30) Foreign Application Priority Data

Aug. 23, 2010 (TW) ............................. 99128141 A

(51) Int. Cl.
*B05C 13/02* (2006.01)
*B65G 47/244* (2006.01)

(52) U.S. Cl.
USPC ........... 118/503; 118/500; 118/728; 118/729; 29/281.1; 198/465.4; 198/377.1; 198/805

(58) Field of Classification Search
USPC ................. 118/500, 503, 728, 729; 29/281.1; 198/465.4, 377.1, 805
See application file for complete search history.

(56) References Cited

U.S. PATENT DOCUMENTS

| | | | | |
|---|---|---|---|---|
| 2,655,128 A * | 10/1953 | Ransburg | ...... | 118/635 |
| 2,952,351 A * | 9/1960 | Stone | ...... | 198/377.1 |
| 5,110,249 A * | 5/1992 | Norman | ...... | 414/217 |
| 5,224,994 A * | 7/1993 | Daly | ...... | 118/53 |
| 7,234,584 B2 * | 6/2007 | Rice et al. | ...... | 198/465.1 |
| 2003/0005884 A1* | 1/2003 | Makimura et al. | ...... | 118/500 |
| 2011/0067628 A1* | 3/2011 | Savoie et al. | ...... | 118/500 |

\* cited by examiner

*Primary Examiner* — Dah-Wei Yuan
*Assistant Examiner* — Stephen Kitt
(74) *Attorney, Agent, or Firm* — Altis Law Group, Inc.

(57) ABSTRACT

A coating device includes a main body, a transport device, at least one loader, a driving device. The main body has a top plate, a bottom plate, and a pair of sidewalls connecting the top plate and bottom plate. The sidewalls respectively define an input gate and an output gate. The transport device includes a transport track passing through the input gate and the output gate, and at least one lifting arm mounted on the transport track. Each loader is configured for loading workpieces and includes a rotary shaft, at least one loading frame rotatably connected with the rotary shaft. The driving device is mounted on the top plate. Each lifting arm is configured for clamping a corresponding loader and transporting the corresponding loader to engage with the driving device. The driving device rotates the corresponding loader rotary shaft through the rotary shaft of the corresponding loader.

12 Claims, 4 Drawing Sheets

COATING DEVICE

BACKGROUND

1. Technical Field

The present disclosure relates to coating technologies and, particularly, to a coating device.

2. Description of Related Art

Generally, physical vapor deposition (PVD) coating devices are broadly used to form functional or decorative metallic films on workpieces. A typical PVD coating device usually comprises a coating chamber and a loader fixed in the coating chamber for loading a plurality of workpieces. It is time-consuming to unload coated workpieces and load new workpieces to be coated between separate coating processes.

Therefore, it is desirable to provide a coating device which can overcome the limitations described.

DETAILED DESCRIPTION

Figure 1:
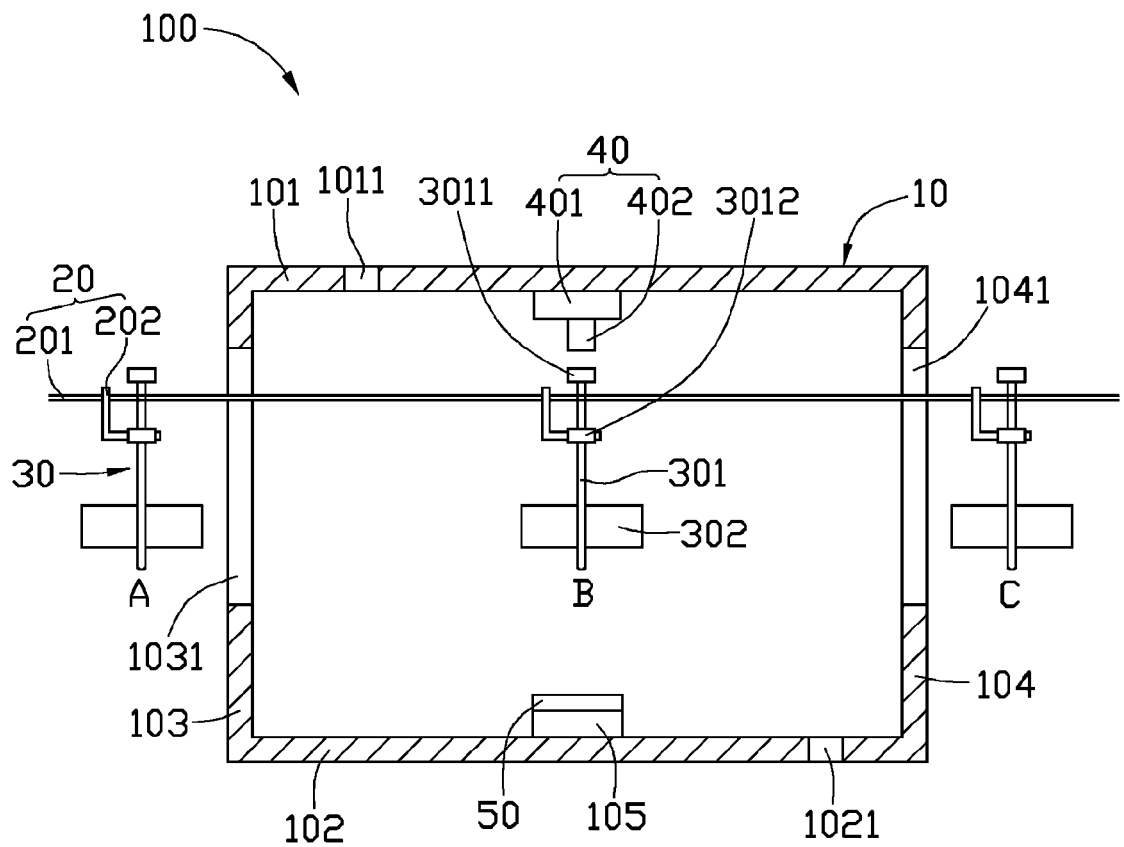
FIG. 1 is a main cross-section of a coating device, according to an exemplary embodiment.

Embodiments of the disclosure will now be described in detail, with reference to the accompanying drawings.

Referring to FIGS. 1-4, a coating device 100, according to an exemplary embodiment, comprises a main body 10, a transport device 20, at least one loader 30, and a first driving device 40.

The main body 10 is generally a cuboid shape and includes a top plate 101, a bottom plate 102 opposite to the top plate 101, and a pair of sidewalls 103 and 104 connecting the top plate 101 and the bottom plate 102. The top plate 101 has a gas intake 1011. The sidewall 103 has an input gate 1031. The sidewall 104 has an output gate 1041. The bottom plate 102 has a gas outlet 1021 and a receiving portion 105 for receiving and heating a target member 50.

The transport device 20 is fixed outside the main body 10, and includes a transport track 201 and at least one lifting arm 202 corresponding to the at least one loader 30. The transport track 201 is in a closed rectangular shape and passes through the main body 10 from the input gate 1031 to the output gate 1041. The lifting arm 202 is mounted on the transport track 201 and configured for clamping and transmitting the loader 30 into or out of the main body 10. The transport device 20 further includes a power source (not shown) for supplying power to the transport track 201.

The loader 30 comprises a first rotary shaft 301, two loading frames 302 rotatably connected to the first rotary shaft 301, a matching portion 3011, an engaging portion 3012, an upper stop 3013, and a lower stop 3014. The matching portion 3011 is ferrous material and fixed on one end of the first rotary shaft 301 by fasteners (not shown). The engaging portion 3012 is adjacent to the matching portion 3011 and integrally formed with the first rotary shaft 301. The engaging portion 3012 is configured for being clamped by the lifting arm 202. The upper stop 3013 and the lower stop 3014 are fixed to the first rotary shaft 301 by fasteners. The two loading frames 302 are limited between the upper stop 3013 and the lower stop 3014.

Each loading frame 302 is generally rectangular and includes a pair of horizontal portions 3021, a pair of vertical portions 3022, a plurality of second rotary shafts 303, and a second driving device 60. The horizontal portions 3021 define a pair of through holes 3023 for receiving the first rotary shaft 301. Each of the second rotary shafts 303 is parallel to the vertical portions 3022 via two ends thereof rotatably connected with the horizontal portions 3021 and defines a plurality of loading portions 3031. The loading portions 3031 are configured for loading workpieces (not shown). The loading portions 3031 between two neighbored of the second rotary shafts 303 are interlaced.

The second driving device 60 is mounted on one of the horizontal portions 3021, includes a host ratchet wheel 601, a belt 602, and a plurality of guest ratchet wheels 603. The number of guest ratchet wheels 603 corresponds to the second rotary shafts 303. Each guest ratchet wheel 603 is connected to one end of each second rotary shaft 303. The belt 602 warps around the host ratchet wheel 601 and the guest ratchet wheels 603. The host ratchet wheel 601 is configured for rotating the guest ratchet wheels 603 to move the belt 602.

The first driving device 40 is mounted on the top plate 101, and includes a first motor 401 and a driving portion 402 connected to the first motor 401. The first motor 401 rotates the driving portion 402. The driving portion 402 is an electromagnet activated for connecting with the matching portion 3011.

In operation, in position A, in front of the input gate 1031, the loader 30 is loaded with workpieces to be coated. In position B, the loader 30 having been transported into the main body 10 via the input gate 1031, the workpieces undergo coating. In position C, having been transported outside main body 10 via the output gate 1041, the coated workpieces are cooled by air and unloaded.

In position A, the input gate 1031 and the output gate 1041 are closed. The loader 30 is loaded with workpieces to be coated. The workpieces are pretreated by hot air applied thereto for cleaning and heating. Input gate 1031 is opened and loader 30 is transported to position B. Before entering the input gate 1031, the loading frames 302 can be manually reoriented so that the included angle therebetween is reduced to an acceptable range (for example about 15 degrees), thus the input gate 1031 can be opened minimally and the loader 30 can pass through, protecting the main body 10 from contamination.

When the loader 30 is in position B and loader 30 is aligned with the first driving device 40, the driving portion 402 is powered on. The lifting arm 202 lifts the loader 30 and enabling matching portion 3011 to attach to the driving portion 402. The driving portion 402 attracts and engages with the matching portion 3011 by magnetic force, and the lifting arm 202 releases the engaging portion 3012. The angle between the two loading frames 302 is manually adjusted to about 90 degrees, thus the workpieces are uniformly distributed in the main body 10. Input gate 1031 is closed and air is evacuated from the main body 10 through the gas outlet 1021, and inert gas such as nitrogen is introduced therein by the gas intake 1011. Target member 50 is heated and coating commences. During coating, the first driving device 40 connects to the matching portion 3011 and drives the loader 30 to rotate, and the loading frame 302 rotates about the first rotary shaft 301. Simultaneously, the second driving device 60 rotates second rotary shafts 303. Thus, the workpieces can simultaneously rotate about the first rotary shaft 301 and the second rotary shaft 303. Accordingly, coatings formed on the workpieces can be more uniform. After coating, the lifting arm 202 clamps the engaging portion 3012, and the driving portion 402 is powered off. The matching portion 3011 is separated from the driving portion 402. The output gate 1041 is opened and the loader 30 is transported out of the main body 10 from the output gate 1041. Before exiting the output gate 1041, the loading frames 302 can be adjusted so that the included angle therebetween is reduced again to an acceptable range. The loader 30 can pass through the output gate 1041 opened to a minimal extent. The loader 30 is transported to position C out of the main body 10 and the output gate 1041 is closed.

In position C out of the main body 10, the coated workpieces are unloaded when cooled by air.

Figure 2:
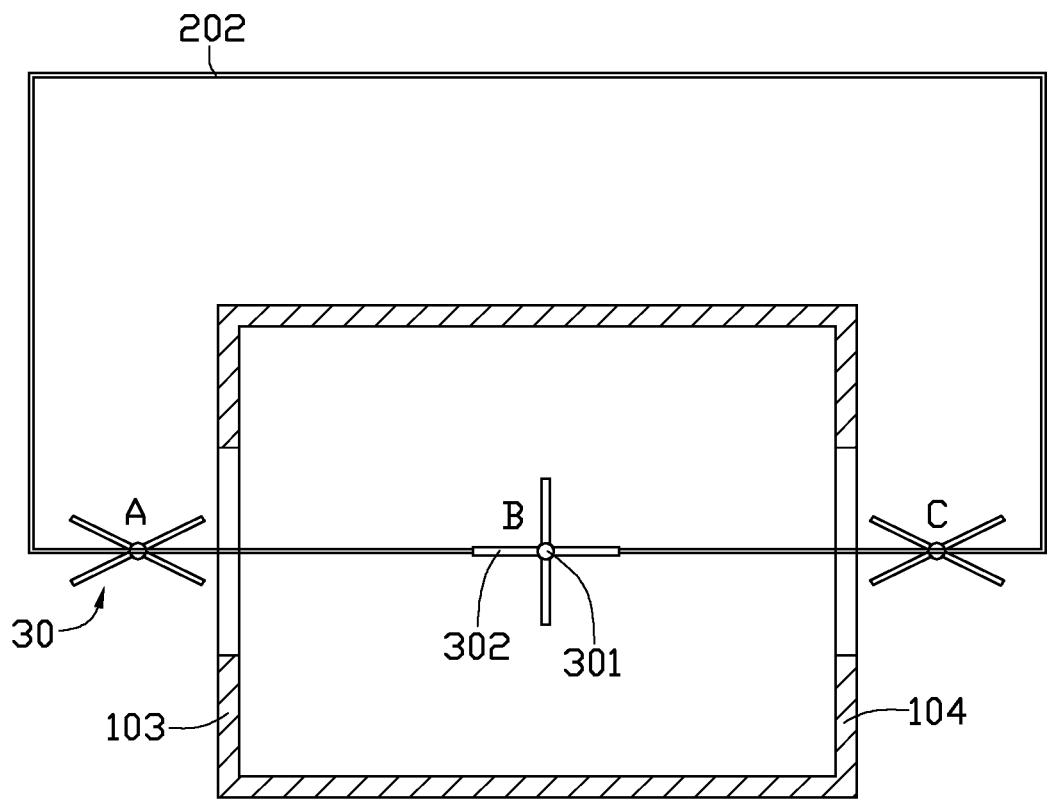
FIG. 2 is a top cross-section of the coating device of FIG. 1.
Figure 3:
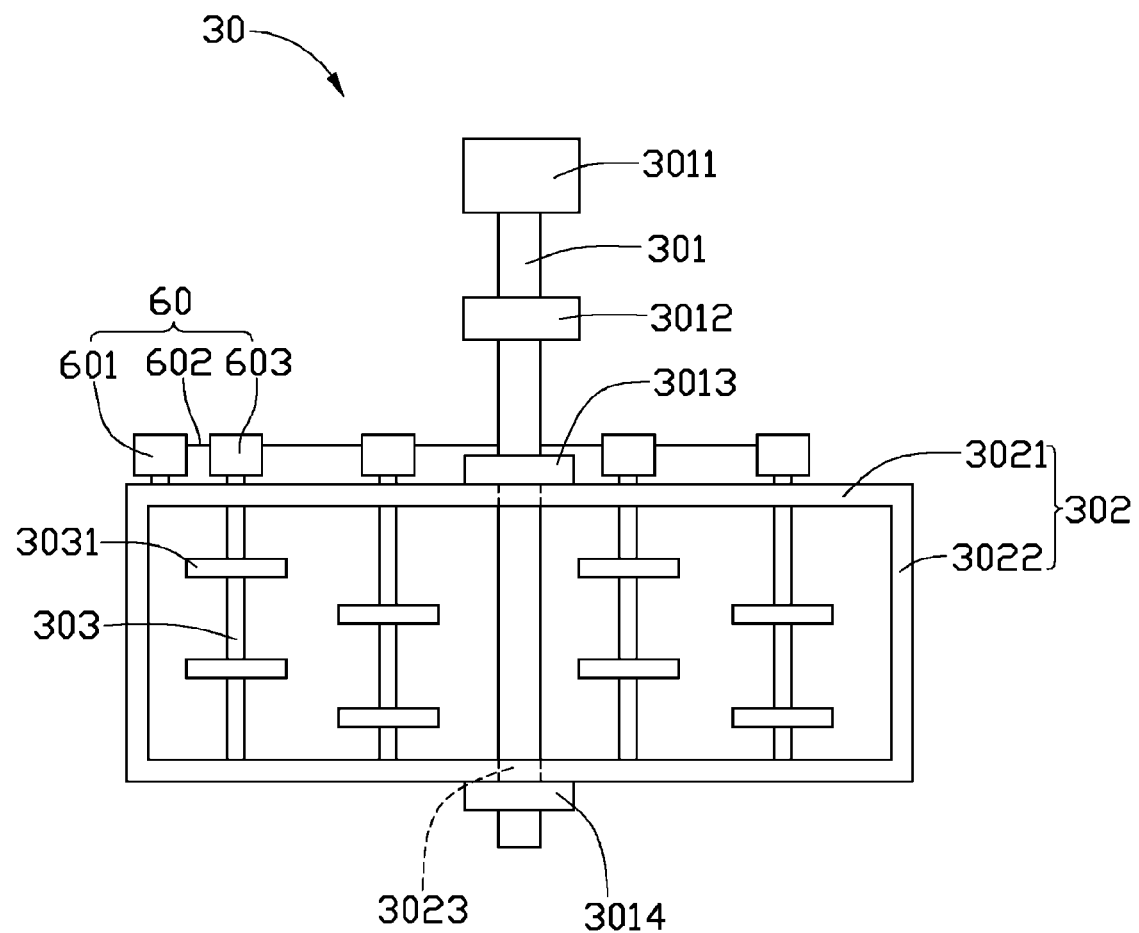
FIG. 3 is a main view of a loader of the coating device of FIG. 2.
Figure 4:
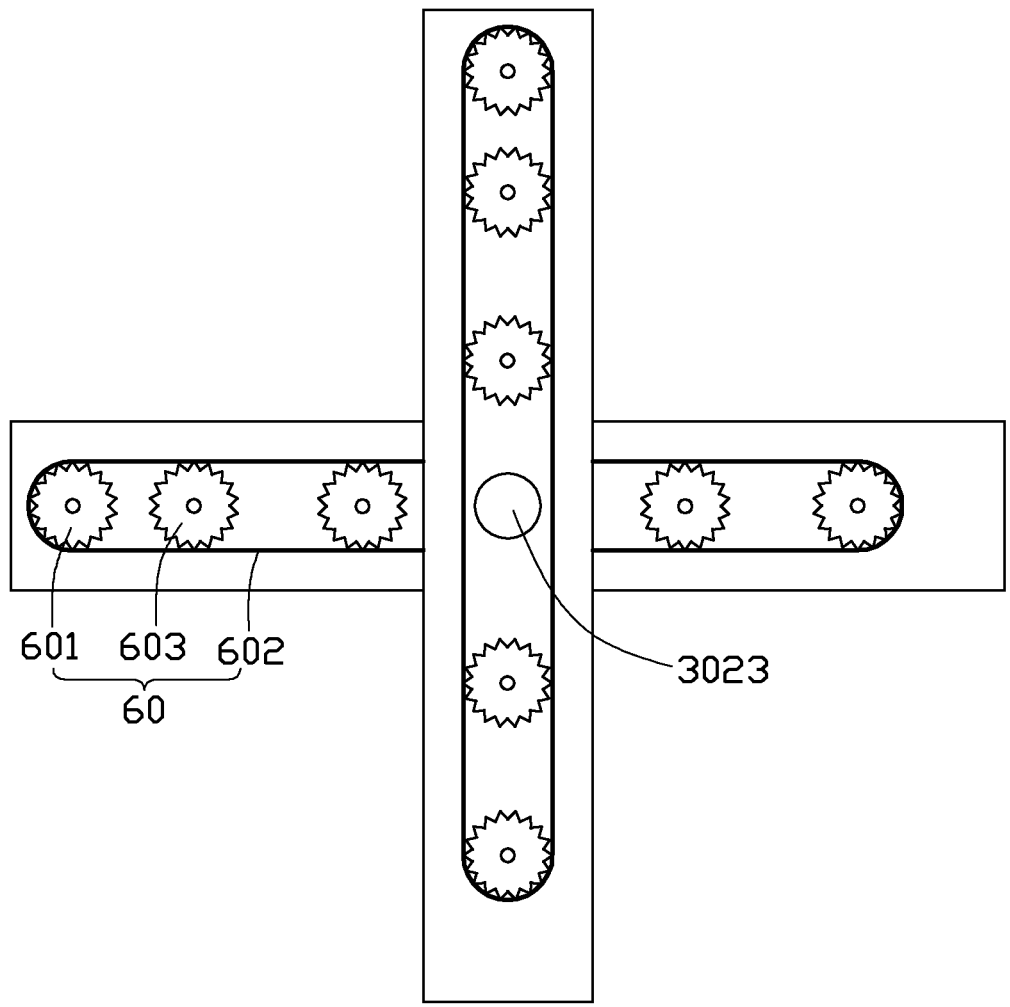
FIG. 4 is a top view of the loader of FIG. 3.

Referring to FIGS. 1 and 2, in the present embodiment, the coating device 100 includes three loaders 30 and three lifting arms 202 corresponding to the three loaders as shown in positions A, B and C. The three loaders 30 are circularly transported from position A to position B and to position C, and then return to position A from position C by the transport device 20.

Use of three loaders 30 saves time and increases coating efficiency.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A coating device for coating a plurality of work-pieces, comprising:
   a main body including a top plate, a bottom plate opposite to the top plate, and a pair of sidewalls connecting the top plate and the bottom plate, the sidewalls respectively defining an input gate and an output gate, the bottom plate having a receiving portion receiving a target member;
   a transport device comprising a transport track passing through the input gate and the output gate, and at least one lifting arm mounted on the transport track;
   at least one loader configured for loading workpieces, each loader comprising a first rotary shaft, and at least one loading frame rotatably connected with the first rotary shaft, each loading frame being generally rectangular and comprising a pair of horizontal portions, a pair of vertical portions, a plurality of second rotary shafts, and a second driving device, each horizontal portion connected between the vertical portions, the second rotary shafts are connected to the second driving device; and
   a first driving device mounted on the top plate;
   wherein each lifting arm is configured for clamping a corresponding loader and transporting the corresponding loader to engage with the first driving device, and the first driving device is configured for driving the corresponding loader to rotate by the first rotary shaft of the corresponding loader.

2. The coating device of claim 1, wherein the first driving device is mounted on the top plate and comprises a first motor and a driving portion connected to the first motor, the first motor is configured for bringing the driving portion to rotate, the driving portion is an electromagnet.

3. The coating device of claim 2, wherein each loader comprises two loading frames connected to the first rotary shaft, a matching portion, an engaging portion, an upper stop and a lower stop.

4. The coating device of claim 3, wherein the matching portion is ferrous material and fixed on one end of the first rotary shaft, the matching portion is configured for engaging with the driving portion.

5. The coating device of claim 4, wherein the engaging portion is adjacent to the matching portion and integrally formed with the first rotary shaft, the engaging portion is configured for being clamped by a corresponding lifting arm.

6. The coating device of claim 5, wherein the upper stop and the lower stop are engaged with the first rotary shaft and limit the loading frames therebetween.

7. The coating device of claim 3, wherein the horizontal portions define a pair of through holes receiving the first rotary shaft, each of the second rotary shafts is parallel to the vertical portions via two ends thereof rotatably connected with the horizontal portions and defines a plurality of loading portions.

8. The coating device of claim 7, wherein the loading portions are configured for loading workpieces and the loading portions between two neighbors of the second rotary shafts are interlaced.

9. The coating device of claim 3, wherein the second driving device is mounted on one of the horizontal portions and includes a host ratchet wheel, a belt, and a plurality of guest ratchet wheels.

10. The coating device of claim 3, wherein the number of the guest ratchet wheels corresponds to the second rotary shafts, each guest ratchet wheel is connected to one end of each second rotary shaft, the host ratchet wheel is mounted on the horizontal portion, the belt wraps around the host ratchet wheel and the guest ratchet wheels, the host ratchet wheel is configured for bringing the guest ratchet wheels to rotate through the belt.

11. The coating device of claim 1, wherein the transport track is closed, and a part of the transport track is received in the main body.

12. The coating device of claim 1, wherein the number of the at least one loader is three and the number of the at least one lifting arm is three.

* * * * *